Figure 1:
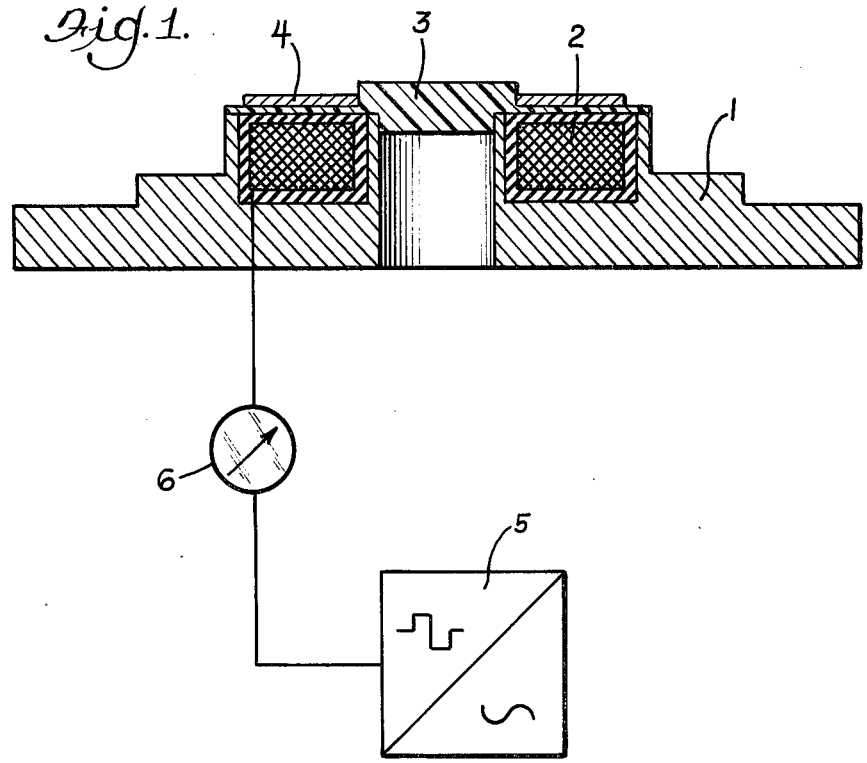

United States Patent [19]
Kreissl

[11] 4,156,188
[45] May 22, 1979

[54] METHOD AND APPARATUS FOR TESTING THE MAGNETIC PROPERTIES OF ROTORS FOR HYSTERESIS MOTORS

[75] Inventor: Ottmar Kreissl, Karlsfeld, Fed. Rep. of Germany

[73] Assignee: Maschinenfabrik Augsburg-Nürnberg Aktiengesellschaft, Augsburg, Fed. Rep. of Germany

[21] Appl. No.: 744,293

[22] Filed: Nov. 23, 1976

Related U.S. Application Data

[63] Continuation-in-part of Ser. No. 685,991, May 13, 1976, abandoned, which is a continuation of Ser. No. 461,026, Apr. 11, 1974, abandoned.

[30] Foreign Application Priority Data

Nov. 25, 1975 [DE] Fed. Rep. of Germany ....... 2552715

[51] Int. Cl.² ............................................. G01R 19/00
[52] U.S. Cl. ............................................. 324/158 MG
[58] Field of Search .................. 324/158 MG, 40, 222, 324/223

[56] References Cited

U.S. PATENT DOCUMENTS

| | | | |
|---|---|---|---|
| 1,479,284 | 1/1924 | Cullin | 324/158 MG |
| 2,217,843 | 10/1940 | Langer | 324/40 |
| 2,504,395 | 4/1958 | Cross | 324/158 MG |

*Primary Examiner*—Theodore M. Blum
*Attorney, Agent, or Firm*—Fitch, Even & Tabin

[57] ABSTRACT

A method and apparatus test the characteristics of rotors for hysteresis motors. A rotor to be tested is placed in predetermined spaced relation adjacent a testing stator having a stator winding. Predetermined voltage at predetermined frequency is applied to the testing stator winding while the rotor is maintained at standstill. Preferably, such voltage and frequency are the rated voltage and frequency of the motor into which it is intended that the rotor being tested will be assembled. The current thereby produced in the stator winding is measured, and the measured current is compared with a predetermined reference. The reference is preferably the current measured in the testing stator winding under the same conditions using a reference rotor that has been tested in a running motor.

8 Claims, 2 Drawing Figures

METHOD AND APPARATUS FOR TESTING THE MAGNETIC PROPERTIES OF ROTORS FOR HYSTERESIS MOTORS

This application is a continuation-in-part of copending application Ser. No. 685,991 filed May 13, 1976, now abandoned which in turn is a continuation of application Ser. No. 461,026, filed Apr. 11, 1974, copending therewith and now abandoned.

The invention relates to testing rotors for hysteresis motors, and more particularly to methods and apparatus for testing the magnetic and electric characteristics of such rotors, and still more particularly where such testing is performed while the rotors being tested are maintained at standstill adjacent a testing stator.

To assure that rated power and rated efficiency are achieved by hysteresis motors, the rotors of such motors must have quite specific magnetic properties; however, inconsistencies in the hardening process and the composition of the material for the rotors cause disturbances in a manner which is unknown and to some extent not reproducible. Therefore, in the production of rotors for hysteresis motors continuous testing will be necessary. Even in a mass production, when high accuracy is required each rotor is to be tested after its manufacture.

A previously known method for testing magnetic characteristics of any such rotor is based on the determination and interpretation of the magnetization curve of the rotor. The test is carried out by assembling the rotor in a test motor and running the motor in accordance with a predetermined test program. This method is uneconomical in most cases, especially in mass production, for it requires a rather long testing time.

The primary object of the present invention is to provide a method for testing the rotors of hysteresis motors which testing, while involving little time and measuring equipment, permits the electric motor characteristics to be determined adequately. Another object is to provide apparatus for performing such method.

In accordance with the present invention a method for testing the magnetic and electric characteristics of rotors for hysteresis motors comprises disposing such a rotor to be tested in predetermined fixed relation adjacent a testing stator having a winding, applying a predetermined voltage at predetermined frequency to the testing stator winding while maintaining the rotor at standstill, measuring the resulting current in the testing stator winding, and comparing this current with a predetermined reference current standard to provide an indication of the acceptability of the rotor as assembled in an operating hysteresis motor.

The current measured in the test is related to motor torque as well as to the area enclosed by the hysteresis loop of the rotor, so that the invention deals with a rather simple and fast method for testing the characteristics of the rotor and the motor made therefrom. As opposed to the previous methods, it is no longer necessary to spend time for accelerating and decelerating and for running off a separate test program.

The test appliance need no longer be capable of operating a motor from standstill; it suffices if a reading is taken of the current flow in all phases of the stator winding and this reading is compared with the predetermined reference standard, with a range of acceptance permitting a certain tolerance scatter.

In a series of running tests it has been demonstrated that standstill current as measured by the present invention accurately correlates with measured motor characteristics within the measuring accuracy and thus permits the utilization of the present invention to check the magnetic properties of rotors for hysteresis motors in a simple manner. As long as the shape, material and crystalline structure of the tested rotors are equivalent within prescribed and usual tolerances, a one-time determination of standstill current is all that is required to give sufficiently accurate particulars of real power absorbed, shaft power, pull-out torque, power factor and efficiency. Beyond this, it is possible to use automated test equipment to print out all the above-mentioned data automatically in the form of a test report, with no special requirements having to be met in setting up the test equipment. On the other hand, a running test calls for completely vibration-free, armoured test stands in view of the high speeds that may be involved (several $10^4$ r.p.m.).

In a preferred embodiment, the same testing stator is used for the measurement in respect to each rotor tested. The use of the same testing stator for respective measurements avoids a relatively large tolerance band. In addition, it is possible to provide a test device which can be used at the place of manufacture of the rotors and thus prevent the delivery of defective items. This fact is of particular significance where extremely large quantities are involved.

According to another preferred embodiment, the predetermined voltage is applied to the stator winding at the rated voltage and frequency of the hysteresis motor in which the rotor is to be assembled. This approximates the testing conditions to the rated operation, thereby eliminating further tolerances which could arise in correlating measured values to rated values.

Preferably the predetermined reference current standard is equal to the standstill current which is measured in the same manner as in the rotor testing, using a stationary reference rotor the operating characteristics of which have already been tested and found acceptable in motor use. This makes it possible to carry out random checks to monitor the reference standard or to obtain quickly applicable reference standards without changing the known running test and without theoretical relationships having to be considered for this purpose.

To keep devices for performing the process as simple and inexpensive as possible, a spacer is placed between the testing stator and the rotor to be tested, the spacer having a shape and magnetic and electric characteristics equivalent to those of the space between the stator and rotor in a running hysteresis motor. The spacer thus acts to place the rotor to be tested in the appropriate fixed relationship to the testing stator during the test procedures. In the case of high speed motors, the space between the stator and rotor has the properties of high vacuum. The thickness of the spacer must be identical to the thickness of the air gap. The spacer can be replaced if it is worn or damaged, whereas the testing stator is retained. In this case, a previously measured rotor can be used to calibrate the new spacer.

Preferably the testing stator has properties equal to those of a stator of an operating hysteresis motor, the rotor of which has properties equivalent to those of the reference rotor. This guarantees optimum obtainable reproducibility of the measuring result; beyond this, it is possible to select from a quantity of mass produced stators several which are substantially identical, which thus serve to produce several substantially identical test appliances. The costly production of special testing stators equivalent to each other can therefore be avoided.

Figure 2:
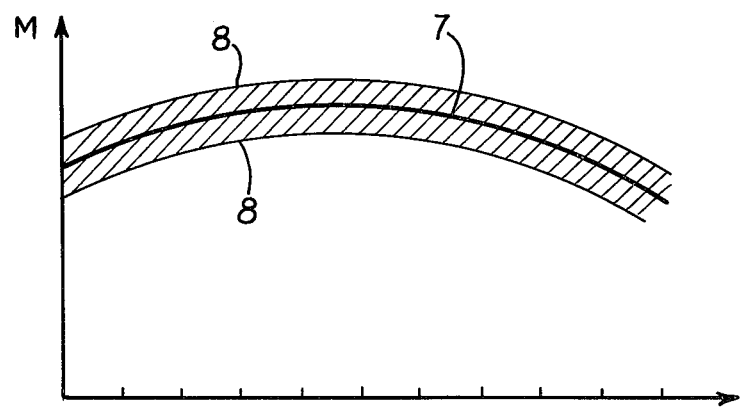

The invention will now be described with reference to an embodiment shown by way of example in the accompanying drawings, in which:

FIG. 1 is an illustration, partly in section and partly diagrammatic, of a testing device of the present invention; and FIG. 2 is a graph of motor torque as a function of current for motors utilizing rotors tested according to the present invention.

In FIG. 1 a device is shown for performing the testing. A testing stator 2 having a stator winding is mounted on a support 1. A spacer 3 is mounted on top of the stator 2. A test rotor 4 is mounted concentrically on and parallel to the top of the spacer 3. Usually the rotor is kept stationary by friction forces between its bottom surface and the upper surface of the spacer. For exceptionally light weight rotors conventional clamping means can be provided. The stator winding is connected to receive the current flowing from a generator 5 of a known type. The current in the stator winding is measured by a measuring apparatus 6 of known type.

During the test the rotor is held stationary on the spacer 3 by means of its weight and the resulting friction force or by clamping means if the friction force due to weight is too small relative to the torque exerted by the magnetic field produced during the test. Upon energization of the stator winding with a predetermined voltage at a predetermined frequency, preferably rated voltage and frequency, a current is established through the stator winding that depends upon the magnetic characteristics of the rotor. This current is measured and compared with a predetermined reference current standard. Where the measured current is equal to the predetermined reference current standard within a predetermined acceptance range, the rotor is considered acceptable for assembly in a hysteresis motor. The predetermined reference current standard can be obtained by measuring the standstill current utilizing a reference rotor the characteristics of which have already been tested in use and found acceptable. The tolerances or range of acceptance may be determined empirically.

The so-called standstill current as measured by the apparatus 6 stands in known relationship to the electromagnetic properties which characterize the hysteresis motor provided with the respective rotor. The relationship between the motor torque M and standstill current I may take the form shown on the diagram in FIG. 2 by means of the curve 7. The curves 8 represent the limits of tolerance.

What is claimed is:

1. A method for testing the characteristics of rotors for hysteresis motors comprising disposing such rotor to be tested in predetermined fixed relation adjacent a testing stator having a stator winding, applying predetermined voltage at predetermined frequency to the testing stator winding while maintaining the rotor at a standstill, measuring the resulting current in the testing stator winding, and comparing the measured current with a predetermined reference current standard to provide an indication of the acceptability of the rotor as assembled in an operating hysteresis motor.

2. A method according to claim 1 wherein the same testing stator is used for each tested rotor.

3. A method according to claim 1 wherein the predetermined voltage and frequency applied to the testing stator are the rated voltage and frequency, respectively, of the hysteresis motor into which the rotor being tested is intended to be assembled.

4. A method according to claim 1 wherein the predetermined reference current standard is equal to the stator winding current which is measured under the test conditions using a stationary reference rotor of the same design as the rotor being tested, the characteristics of said reference rotor having already been tested in an operating motor and found acceptable.

5. A method according to claim 4 wherein the testing stator has properties equivalent to those of the stator of a hysteresis motor the rotor of which has properties equivalent to those of said reference rotor.

6. A method according to claim 1 wherein a spacer is placed between the testing stator and the rotor to be tested to assure that said rotor is disposed in proper predetermined position relative to said stator.

7. Apparatus for testing the characteristics of rotors for hysteresis motors comprising a testing stator having a stator winding, a spacer mounted on said stator for positioning rotors to be tested in predetermined position relative to said stator and spaced a predetermined distance therefrom, means for applying predetermined voltage at predetermined frequency to said stator winding, and means for measuring the current thereupon flowing in said stator winding while the rotor being tested is at standstill.

8. Apparatus according to claim 7 wherein said testing stator has properties equivalent to those of the stator of the hysteresis motor in which the rotor to be tested is intended to be assembled.

* * * * *